United States Patent
Liu et al.

(10) Patent No.: US 11,611,053 B2
(45) Date of Patent: Mar. 21, 2023

(54) LIGHT-EMITTING DEVICE, DISPLAY PANEL AND DRIVING METHOD OF LIGHT-EMITTING DEVICE

(71) Applicant: BOE Technology Group Co., Ltd., Beijing (CN)

(72) Inventors: Huameng Liu, Beijing (CN); Haidong Wu, Beijing (CN); Bei Wang, Beijing (CN); Xiaobo Du, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/483,574

(22) Filed: Sep. 23, 2021

(65) Prior Publication Data
US 2022/0238826 A1   Jul. 28, 2022

(30) Foreign Application Priority Data
Jan. 25, 2021   (CN) .......................... 202110095202.9

(51) Int. Cl.
*G09G 3/30* (2006.01)
*H01L 51/50* (2006.01)
(Continued)

(52) U.S. Cl.
CPC ......... *H01L 51/504* (2013.01); *G09G 3/3208* (2013.01); *H01L 27/3211* (2013.01)

(58) Field of Classification Search
CPC ............. H01L 51/5044; H01L 51/5265; H01L 51/5096; H01L 51/56; H01L 51/001; H01L 51/0011; H01L 51/5064; H01L 51/5024; H01L 51/504; H01L 51/5012; H01L 51/5036; H01L 51/5056; H01L 51/5072; H01L 51/5092; H01L 51/5088;
(Continued)

(56) References Cited

U.S. PATENT DOCUMENTS

2020/0273916 A1*   8/2020   Jiao ...................... H01L 51/504

FOREIGN PATENT DOCUMENTS

| CN | 101562234 | * 10/2009 | ............. H01L 51/50 |
| CN | 101562234 A | 10/2009 | |

(Continued)

OTHER PUBLICATIONS

CN202110095202.9 first office action.

*Primary Examiner* — Jennifer T Nguyen
(74) *Attorney, Agent, or Firm* — IPro, PLLC

(57) ABSTRACT

Disclosed are a light-emitting device, a display panel, and a driving method of the light-emitting device. The light-emitting device includes: a base substrate, a first electrode on a side of the base substrate, a second electrode on a side, facing away from the base substrate, of the first electrode, and at least two blue light-emitting layers located between the first electrode and the second electrode. Different blue light-emitting layers emit light with different wavelengths. The first electrode and the second electrode are configured to be applied with different voltages. A voltage difference between the first electrode and the second electrode includes a first threshold voltage and a second threshold voltage, and under control of the first threshold voltage, one of the blue light-emitting layers emits light; and under control of the second threshold voltage, another blue light-emitting layer emits light.

10 Claims, 4 Drawing Sheets

(51) Int. Cl.
*G09G 3/3208* (2016.01)
*H01L 27/32* (2006.01)

(58) Field of Classification Search
CPC ........... H01L 2251/558; H01L 27/3209; H01L 27/3216; H01L 27/321; H01L 27/3244; H01L 27/3206; H01L 27/326; H01L 27/3211; H01L 27/3218; G09G 3/3208
USPC .......................................................... 345/76
See application file for complete search history.

(56) References Cited

FOREIGN PATENT DOCUMENTS

| | | |
|---|---|---|
| CN | 109065740 A | 12/2018 |
| CN | 110707240 A | 1/2020 |
| CN | 110890473 A | 3/2020 |
| JP | 2012234733 A | 11/2012 |

* cited by examiner

LIGHT-EMITTING DEVICE, DISPLAY PANEL AND DRIVING METHOD OF LIGHT-EMITTING DEVICE

CROSS REFERENCE TO RELATED APPLICATIONS

This application is based on and claims priority under 35 U.S.C 119 to Chinese Patent Application No. 202110095202.9, filed on Jan. 25, 2021, in the China National Intellectual Property Administration. The entire disclosure of the above application is incorporated herein by reference.

FIELD

The present disclosure relates to the field of semiconductor technology, in particular to a light-emitting device, a display panel and a driving method of the light-emitting device.

BACKGROUND

An organic light-emitting diode (OLED) has a wide viewing angle, excellent contrast, fast response, high brightness, a low driving voltage, flexibility and other properties that have attracted great attention.

The OLED has the advantage of wide color gamut. While the range of blue light emitted by such OLED belongs to dark blue. The blue light may penetrate lenses of eyes and damage photosensitive cells on retinas. If the eyes are exposed to a lot of blue light for a long time, it may cause deterioration of vision.

SUMMARY

The present disclosure provides a light-emitting device, a display panel, and a driving method of the light-emitting device.

Embodiments of the present disclosure provide a light-emitting device. The device includes: a base substrate, a first electrode on a side of the base substrate, a second electrode on a side, facing away from the base substrate, of the first electrode, and at least two blue light-emitting layers located between the first electrode and the second electrode. The different blue light-emitting layers emit light with different wavelengths. The first electrode and the second electrode are configured to be applied with different voltages, a voltage difference between the first electrode and the second electrode includes a first threshold voltage and a second threshold voltage. Under control of the first threshold voltage, one of the blue light-emitting layers emits light; and under control of the second threshold voltage, another blue light-emitting layer emits light.

An embodiment of the present disclosure further provides a display panel, including a light-emitting device emitting blue light, and at least one light-emitting device that emits light in colors other than blue light. The device emitting blue light includes: a base substrate, a first electrode on a side of the base substrate, a second electrode on a side, facing away from the base substrate, of the first electrode, and at least two blue light-emitting layers located between the first electrode and the second electrode. The different blue light-emitting layers emit light with different wavelengths. The first electrode and the second electrode are configured to be applied with different voltages, a voltage difference between the first electrode and the second electrode includes a first threshold voltage and a second threshold voltage. Under control of the first threshold voltage, one of the blue light-emitting layers emits light; and under control of the second threshold voltage, another blue light-emitting layer emits light.

An embodiment of the present disclosure further provides a driving method of a light-emitting device. The device emitting blue light includes: a base substrate, a first electrode on a side of the base substrate, a second electrode on a side, facing away from the base substrate, of the first electrode, and at least two blue light-emitting layers located between the first electrode and the second electrode. The different blue light-emitting layers emit light with different wavelengths. The driving method includes: providing the light-emitting device; and applying voltages to the first electrode and the second electrode of the light-emitting device. where a voltage difference between the first electrode and the second electrode is controlled to comprise a first threshold voltage and a second threshold voltage. Under control of the first threshold voltage, one blue light-emitting layer of the at least two blue light-emitting layers emits light; and under control of the second threshold voltage, another blue light-emitting layer of the at least two blue light-emitting layers emits light.

DETAILED DESCRIPTION

In order to make the objectives, technical solutions, and advantages of embodiments of the present disclosure clearer, the technical solutions of the embodiments of the present disclosure will be clearly and fully described in combination with the accompanying drawings of the embodiments of the present disclosure. It is apparent that the described embodiments are some, but not all, embodiments of the present disclosure. Based on the described embodiments of the present disclosure, all other embodiments attainable by those ordinary skilled in the art without involving any inventive effort are within the scope of the present disclosure.

Unless otherwise defined, the technical terms or scientific terms used in the present disclosure shall have the usual meanings understood by those with ordinary skills in the field to which the present disclosure belongs. "First", "second" and similar words used in the present disclosure do not indicate any order, quantity or importance, but are only used to distinguish different components. "Comprise" or "include" or other similar words mean that the element or item appearing before the word covers elements or items listed after the word and their equivalents, but does not exclude other elements or items. "Connecting" or "connected" or other similar words are not limited to physical or mechanical connections, but may include electrical connections, whether direct or indirect. "Upper", "lower", "left", "right", and the like are used merely to denote a relative positional relationship that may change accordingly when the absolute position of the object being described changes.

In order to keep the following descriptions of the embodiments of the present disclosure clear and concise, detailed descriptions of known functions and known components are omitted from the present disclosure.

Figure 1:
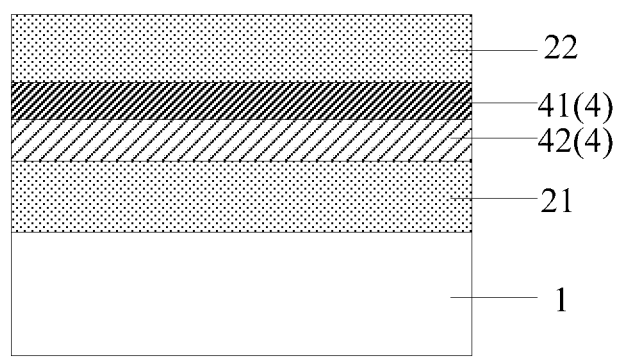
FIG. 1 illustrates an example first light-emitting device according to some embodiments of the present disclosure.

Referring to FIG. 1, embodiments of the present disclosure provide a light-emitting device. The light-emitting device includes:
- a base substrate 1;
- a first electrode 21 on a side of the base substrate 1;
- a second electrode 22 on a side, facing away from the base substrate 1, of the first electrode 21; and
- at least two blue light-emitting layers 4 between the first electrode 21 and the second electrode 22.

The different blue light-emitting layers 4 emit light with different wavelengths. The first electrode 21 and the second electrode 22 are configured to receive different voltages. A voltage difference between the first electrode 21 and the second electrode 22 includes a first threshold voltage and a second threshold voltage. One of the blue light-emitting layers 4 emits light at the first threshold voltage, and another blue light-emitting layer 4 emits light at the second threshold voltage.

In the embodiments of the present disclosure, at least two light-emitting layers are disposed between the first electrode and the second electrode. The different blue light-emitting layers emit light with different wavelengths. Since the shorter a wavelength, the darker corresponding blue light, light emitted by the blue light-emitting layers can be divided into light blue and dark blue. When a light-emitting center is in a blue light-emitting layer with a longer light-emitting wavelength, the light-emitting device can emit light blue light, namely being in an eye-protection mode. When the light-emitting center is in a blue light-emitting layer with a shorter light-emitting wavelength, the light-emitting device can emit dark blue light, namely being in a normal mode. Thus, the problem in the related art that blue light emitted by a light-emitting device damages human eyes, can be alleviated.

In some embodiments, each blue light-emitting layer 4 includes a main light-emitting part and an auxiliary light-emitting part mixed in the main light-emitting part. The auxiliary light-emitting parts of the different blue light-emitting layers 4 are different. In the embodiments of the present disclosure, since the auxiliary light-emitting parts of the different blue light-emitting layers 4 are different, the different blue light-emitting layers may emit blue light with different color depths by adjusting auxiliary light-emitting materials of the different blue light-emitting layers 4.

In some embodiments, the main light-emitting parts of the different blue light-emitting layers 4 are same.

In some embodiments, as shown in FIG. 1, there are two blue light-emitting layers 4, including a first blue light-emitting layer 41 and a second blue light-emitting layer 42. Both are disposed between the first electrode 21 and the second electrode 22. A light-emitting wavelength of the first blue light-emitting layer 41 is shorter than a light-emitting wavelength of the second blue light-emitting layer 42. In some embodiments, more than two blue light-emitting layers 4, for example, 3, 4, 5, N layers (N is an integer greater than 2), may be disposed between the first electrode 21 and the second electrode 22, so as to achieve light-emitting modes with more different color depths.

Figure 2:
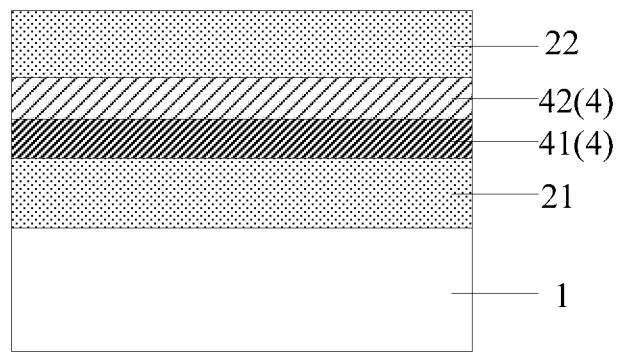
FIG. 2 illustrates an example second light-emitting device according to some embodiments of the present disclosure.

In some embodiments, the first electrode 21 is an anode, and the second electrode 22 is a cathode. The first blue light-emitting layer 41 is on a side, facing the first electrode 21, of the second blue light-emitting layer 42, as shown in FIG. 2. Or, the first blue light-emitting layer 41 is on a side, facing away from the first electrode 21, of the second blue light-emitting layer 42, as shown in FIG. 1.

Figure 3:
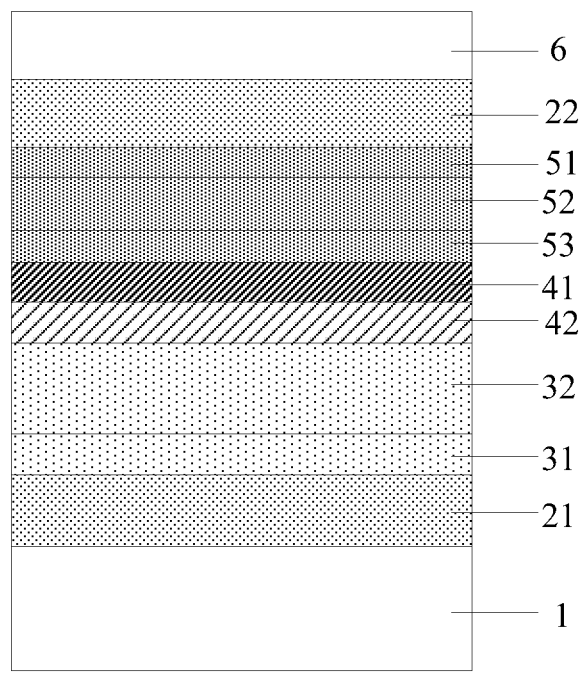
FIG. 3 illustrates an example third light-emitting device according to some embodiments of the present disclosure.
Figure 4:
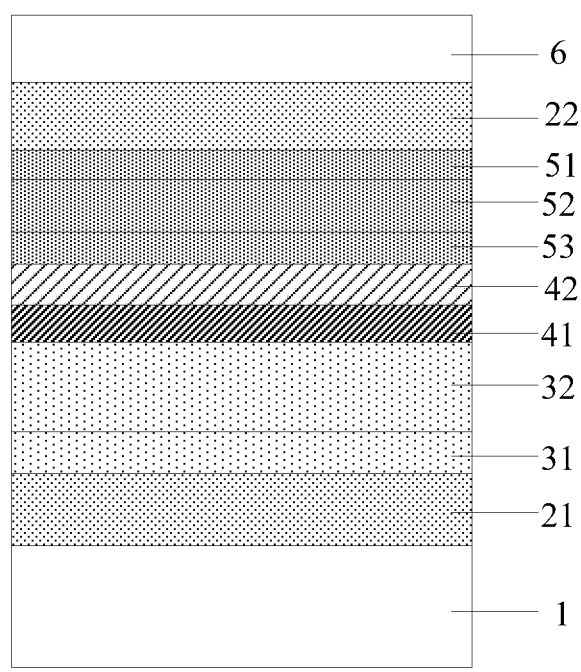
FIG. 4 illustrates an example fourth light-emitting device according to some embodiments of the present disclosure.

In some embodiments, referring to FIG. 3 and FIG. 4, FIG. 3 shows that the first blue light-emitting layer 41 is on the side, facing away from the first electrode 21, of the second blue light-emitting layer 42, and FIG. 4 shows that the first blue light-emitting layer 41 is on the side, facing the first electrode 21, of the second blue light-emitting layer 42. The blue light-emitting layers 4 between the first electrode 21 and the second electrode 22 constitute a blue light-emitting layer group. A hole injection layer 31 is disposed between the first electrode 21 and the blue light-emitting layer group, and a hole transport layer 32 is disposed between the hole injection layer 31 and the blue light-emitting layer group. An electron injection layer 51 is disposed between the second electrode 22 and the blue light-emitting layer group, an electron transport layer 52 is disposed between the electron injection layer 51 and the blue light-emitting layer group, and a hole blocking layer 53 is disposed between the electron transport layer 52 and the blue light-emitting layer group. In some embodiments, an encapsulation layer 6 may further be disposed on a side, facing away from the electron injection layer 51, of the second electrode 22.

In some embodiments, the light-emitting center may be located at different positions by controlling the voltage difference between the first electrode 21 and the second electrode 22, that is, the light-emitting center of the light-emitting device is controlled by different voltages, as illustrated below.

For example, taking a structure of the light-emitting device shown in FIG. 3 as an example, the first electrode 21 is the anode, the second electrode 22 is the cathode, the light-emitting wavelength of the first blue light-emitting layer 41 is smaller than that of the second blue light-emitting layer 42 (that is, the first blue light-emitting layer 41 is a blue light-emitting layer that emits dark blue light, and the second blue light-emitting layer 42 is a blue light-emitting layer that emits light blue light), and the first blue light-emitting layer 41 is on the side, facing away from the first electrode 21, of the second blue light-emitting layer 42. When the voltage difference between the first electrode 21 and the second electrode 22 is controlled to be at a low level (the first threshold voltage is controlled to be 0 V-3 V, that is, the voltage difference between the first electrode 21 and the second electrode 22 is greater than 0 V and less than 3.0 V), hole mobility of the light-emitting device is high, at this moment, the light-emitting center is in the first blue light-emitting layer 41, a chromaticity coordinate of emission of the light-emitting device is 0.030-0.045, the light-emitting wavelength is 435 nm-475 nm, a half-peak width is 15 nm-20 nm, and the light-emitting device emits the dark blue light, namely the normal mode. For example, the first threshold voltage is controlled to be 1 V-2 V, the light-emitting center is in the first blue light-emitting layer 41, and the chromaticity coordinate of emission of the light-emitting device is 0.035-0.040. When the voltage difference between the first electrode 21 and the second electrode 22 is controlled to be at a high level (the second threshold voltage is controlled to be 4 V-7 V, that is, the voltage difference between the first electrode 21 and the second electrode 22 is greater than 4.0 V and less than 7 V), the electron mobility becomes higher, the light-emitting center of the light-emitting device is limited in the second blue light-emitting layer 42, the chromaticity coordinate of emission of the light-emitting device is 0.045-0.100, the light-emitting wavelength is 475 nm-485 nm, the half-peak width is 15 nm-20 nm, and the light-emitting device emits the light blue light, namely the eye-protection mode. For example, the second threshold voltage is controlled to be 5 V-6 V, the light-emitting center of the light-emitting device is limited in the second blue light-emitting layer 42, and the chromaticity coordinate of emission of the light-emitting device is 0.065-0.085.

For another example, taking a structure of the light-emitting device shown in FIG. 4 as an example, the first electrode 21 is the anode, the second electrode 22 is the cathode, the light-emitting wavelength of the first blue light-emitting layer 41 is smaller than that of the second blue light-emitting layer 42 (that is, the first blue light-emitting layer 41 is a blue light-emitting layer that emits dark blue light, and the second blue light-emitting layer 42 is a blue light-emitting layer that emits light blue light), and the first blue light-emitting layer 41 is on the side, facing the first electrode 21, of the second blue light-emitting layer 42. When the voltage difference between the first electrode 21 and the second electrode 22 is controlled to be at a low level (the first threshold voltage is controlled to be 0 V-3 V, that is, the voltage difference between the first electrode 21 and the second electrode 22 is greater than 0 V and less than 3.0 V), the hole mobility of the light-emitting device is high. At this moment, the light-emitting center is in the second blue light-emitting layer 42, the chromaticity coordinate of emission of the light-emitting device is 0.045-0.100, the light-emitting wavelength is 475 nm-485 nm, the half-peak width is 15 nm-20 nm, and the light-emitting device emits the light blue light, namely the eye-protection mode. For example, when the first threshold voltage is controlled to be 1 V-2 V, the light-emitting center is in the second blue light-emitting layer 42, and the chromaticity coordinate of emission of the light-emitting device is 0.065-0.085. When the voltage difference between the first electrode 21 and the second electrode 22 is controlled to be at a high level (the second threshold voltage is controlled to be 4 V-7 V, that is, the voltage difference between the first electrode 21 and the second electrode 22 is greater than 4 V and less than 7 V), the electron mobility becomes higher, the light-emitting center of the light-emitting device is limited in the first blue light-emitting layer 41. Accordingly, the chromaticity coordinate of emission of the light-emitting device is 0.030-0.045, the light-emitting wavelength is 435 nm-475 nm, the half-peak width is 15 nm-20 nm, and the light-emitting device emits the dark blue light, namely being in the normal mode. For example, the second threshold voltage is controlled to be 5 V-6 V, the light-emitting center of the light-emitting device is limited in the first blue light-emitting layer 41, and the chromaticity coordinate of emission of the light-emitting device is 0.035-0.040.

Figure 5:
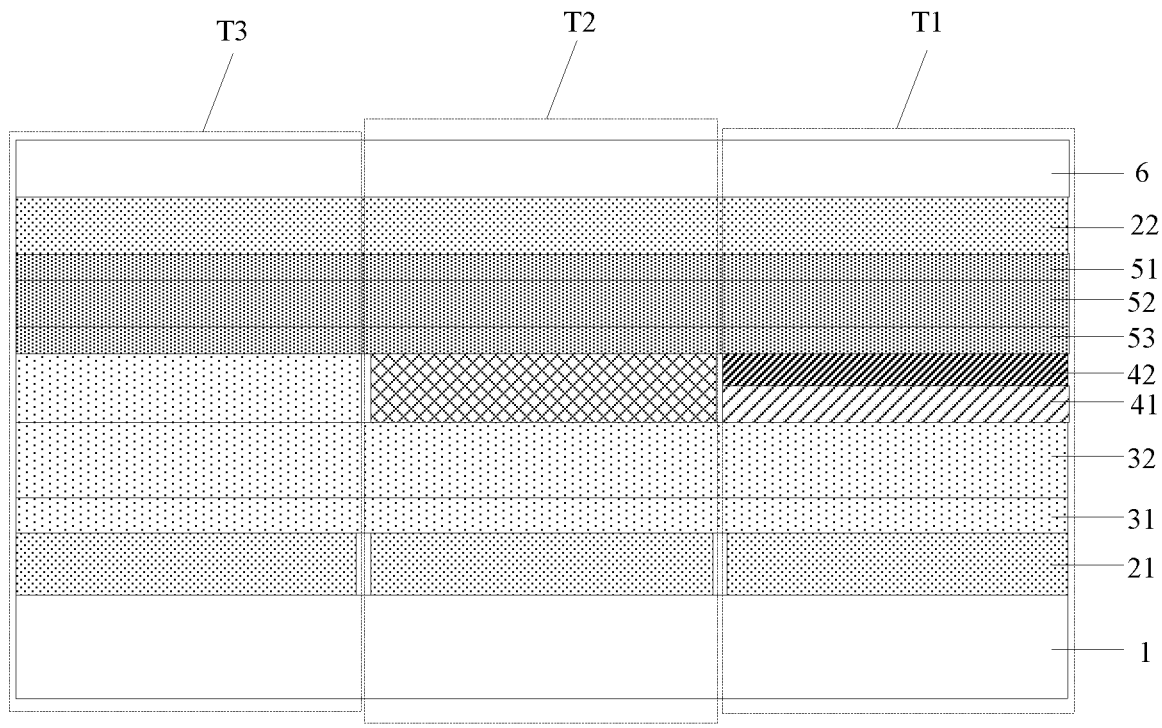
FIG. 5 illustrates an example display panel according to some embodiments of the present disclosure.

In some embodiments, the light-emitting device may be a monochromatic light-emitting device that emits only blue light, or may be one blue light-emitting device among all light-emitting devices in a display panel, as a sub-pixel. For example, as shown in FIG. 5, embodiments further provide a display panel. The display panel includes the light-emitting device T1 provided by the embodiments of the present disclosure, and the light-emitting device T1 may be a blue light-emitting device that emits blue light. The display panel further includes at least one light-emitting device that emits light in colors other than blue light. In some embodiments, the display panel further includes a red light-emitting device T2 and a green light-emitting device T3.

In some embodiments, a hole injection layer 31, a hole transport layer 32, an electron injection layer 51, an electron transport layer 52, a hole blocking layer 53 and a cathode layer 22 of the light-emitting device T1 that emits blue light as provided in the embodiments of the present disclosure, are shared by the red light-emitting device T2. The hole injection layer 31, the hole transport layer 32, the electron injection layer 51, the electron transport layer 52, the hole blocking layer 53 and the cathode layer 22 of the light-emitting device T1 that emits blue light as provided in the embodiments of the present disclosure, are shared by the green light-emitting device T3.

Figure 6:
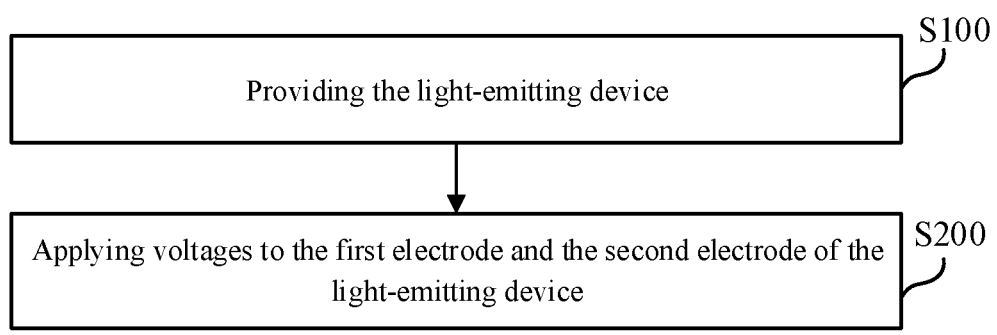
FIG. 6 illustrates an example driving method of a light-emitting device according to some embodiments of the present disclosure.

Based on the same inventive concept, an embodiment of the present disclosure further provides a driving method of the light-emitting device as provided in the embodiments of the present disclosure, as shown in FIG. 6. The method includes:

S100, providing the light-emitting device; and

S200, applying voltages to the first electrode and the second electrode of the light-emitting device; where a voltage difference between the first electrode and the second electrode is controlled to include a first threshold voltage and a second threshold voltage, to allow one of blue light-emitting layers of the light-emitting layer to emit light under control of the first threshold voltage, and another blue light-emitting layer to emit light under control of the second threshold voltage.

In some embodiments, the first electrode is an anode, the second electrode is a cathode, and two blue light-emitting layers are disposed between the first electrode and the second electrode.

Figure 7:
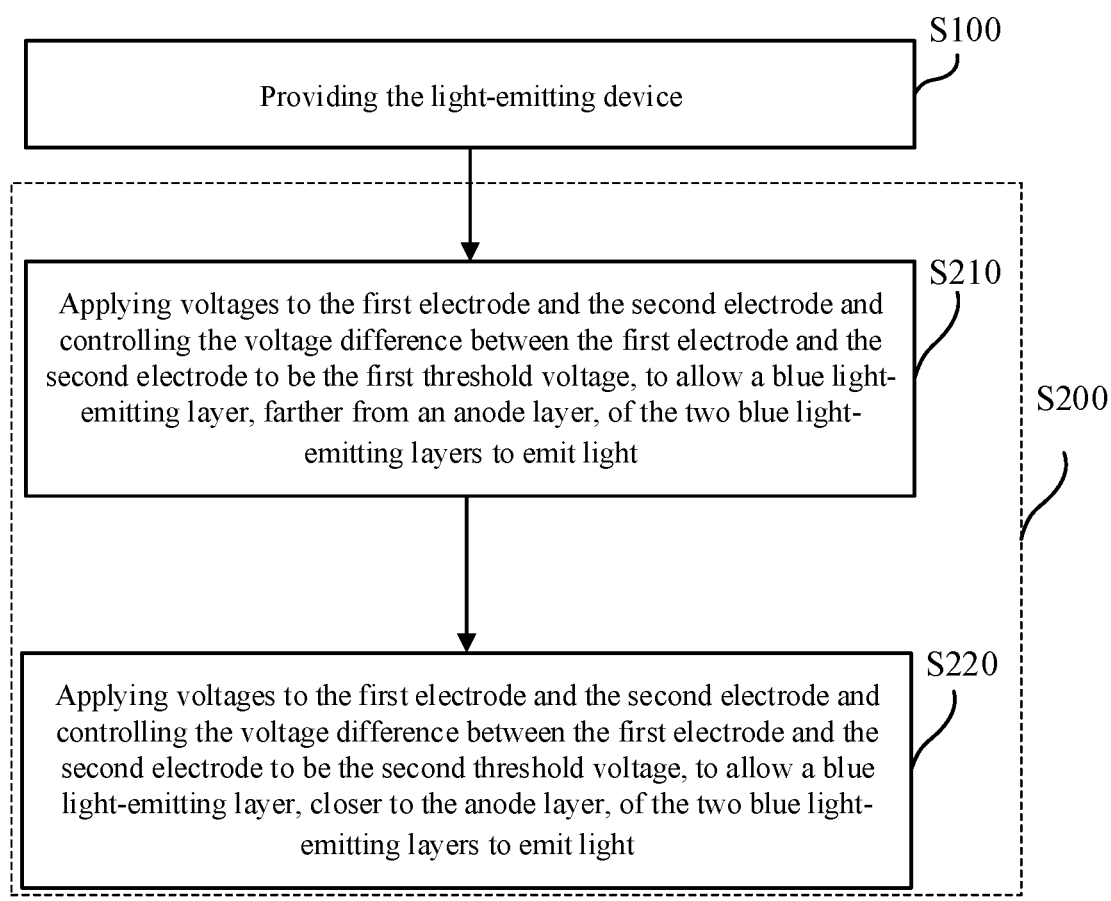
FIG. 7 illustrates another example driving method of a light-emitting device according to some embodiments of the present disclosure.

In some embodiments, as shown in FIG. 7, applying voltages to the first electrode and the second electrode of the light-emitting device, includes the following.

S210, applying voltages to the first electrode and the second electrode and controlling the voltage difference between the first electrode and the second electrode to be the first threshold voltage, to allow a blue light-emitting layer farther from an anode layer, of the two blue light-emitting layers to emits light. In some embodiments, the first threshold voltage may be 0 V-3 V, accordingly, the voltage difference between the first electrode and the second electrode is controlled to be 0 V-3 V.

S220, applying voltages to the first electrode and the second electrode and controlling the voltage difference between the first electrode and the second electrode to be the second threshold voltage, to allow a blue light-emitting layer, closer to the anode layer, of the two blue light-emitting layers to emits light, wherein the second threshold voltage is greater than the first threshold voltage. In some embodiments, the second threshold voltage may be 4 V-7 V, and accordingly, the voltage difference between the first electrode and the second electrode is controlled to be 4 V-7 V.

The beneficial effects of the embodiments of the present disclosure are as follows: in the embodiments of the present disclosure, at least two light-emitting layers are disposed between the first electrode and the second electrode, the different blue light-emitting layers emit light with different wavelengths. Since the shorter a wavelength, the darker corresponding blue light, light emitted by the blue light-emitting layers can be divided into light blue and dark blue. When the light-emitting center is in a blue light-emitting layer with a longer light-emitting wavelength, the light-emitting device can emit light blue light, thereby being in the eye-protection mode. When the light-emitting center is in a blue light-emitting layer with a shorter light-emitting wavelength, the light-emitting device can emit dark blue light, thereby being in the normal mode. Thus, the problem that in the prior art, the blue light emitted by the light-emitting device damages human eyes can be alleviated.

It will be apparent to those skilled in the art that various modifications and variations can be made in the present disclosure without departing from the spirit or scope of the present disclosure. Thus, it is intended that the present disclosure covers the modifications and variations of the present disclosure provided they come within the scope of the appended claims and their equivalents.

What is claimed is:

1. A display panel, comprising:
   a red light-emitting device;
   a green light-emitting device; and
   a blue light-emitting device;
   wherein the blue light-emitting device comprises:
      a base substrate;
      a first electrode on a side of the base substrate;
      a hole injection layer on a side, facing away from the base substrate, of the first electrode;
      a hole transport layer on a side, facing away from the first electrode, of the hole injection layer;
      at least two blue light-emitting layers on a side, facing away from the hole injection layer, of the hole transport layer;
      a hole blocking layer on a side, facing away from the hole transport layer, of the at least two blue light-emitting layers;
      an electron transport layer on a side, facing away from the at least two blue light-emitting layers, of the hole blocking layer;
      an electron injection layer on a side, facing away from the hole blocking layer, of the electron transport layer; and
      a second electrode on a side, facing away from the electron transport layer, of the electron injection layer;
   wherein
      different blue light-emitting layers emit light with different wavelengths;
      the first electrode and the second electrode are configured to be applied with different voltages, wherein
         a voltage difference between the first electrode and the second electrode comprises a first threshold voltage and a second threshold voltage;
         under control of the first threshold voltage, one blue light-emitting layer of the at least two blue light-emitting layers emits light; and
         under control of the second threshold voltage, another blue light-emitting layer of the at least two blue light-emitting layers emits light;
      wherein
         the first threshold voltage is 0 V-3 V;
         the second threshold voltage is 4 V-7 V;
         the hole injection layer, the hole transport layer, the electron injection layer, the electron transport layer, and the hole blocking layer of the blue light-emitting device are shared by the red light-emitting device and the green light-emitting device; wherein the red light-emitting device comprises a red light-emitting layer between the hole transport layer and the hole blocking layer; and the green light-emitting device comprises a green light-emitting layer between the hole transport layer and the hole blocking layer;
      each blue light-emitting layer comprises a main light-emitting part, and an auxiliary light-emitting part mixed in the main light-emitting part; and
      auxiliary light-emitting parts of the different blue light-emitting layers are different; and
   main light-emitting parts of the different blue light-emitting layers are same.

2. The display panel according to claim 1, wherein two blue light-emitting layers comprising a first blue light-emitting layer and a second blue light-emitting layer, are disposed on a side, facing away from the hole injection layer, of the hole transport layer;
   wherein a wavelength of light emitted from the first blue light-emitting layer is smaller than a wavelength of light emitted from the second blue light-emitting layer.

3. The display panel according to claim 2, wherein
   the first electrode is an anode, and the second electrode is a cathode; and
   the first blue light-emitting layer is on a side, facing the hole transport layer, of the second blue light-emitting layer.

4. The display panel according to claim 3, wherein under control of the first threshold voltage, the second blue light-emitting layer emits light, a chromaticity coordinate of emission of the light-emitting device is 0.045-0.100, a wavelength is 475 nm-485 nm, and a half-peak width is 15 nm-20 nm.

5. The display panel according to claim 3, wherein under control of the second threshold voltage, the first blue light-emitting layer emits light, a chromaticity coordinate of emission of the light-emitting device is 0.030-0.045, a wavelength is 435 nm-475 nm, and a half-peak width is 15 nm-20 nm.

6. The display panel according to claim 2, wherein
   the first electrode is an anode, and the second electrode is a cathode; and
   the first blue light-emitting layer is on a side, facing away from the hole transport layer, of the second blue light-emitting layer.

7. The display panel according to claim 6, wherein under control of the first threshold voltage, the first blue light-emitting layer emits light, a chromaticity coordinate of emission of the light-emitting device is 0.030-0.045, a wavelength is 435 nm-475 nm, and a half-peak width is 15 nm-20 nm.

8. The display panel according to claim 6, wherein under control of the second threshold voltage, the second blue light-emitting layer emits light, a chromaticity coordinate of emission of the light-emitting device is 0.045-0.100, a wavelength is 475 nm-485 nm, and a half-peak width is 15 nm-20 nm.

9. A method for driving the blue light-emitting device according to claim 1, comprising:
   providing the blue light-emitting device; and
   applying voltages to the first electrode and the second electrode of the blue light-emitting device;
      wherein the voltage difference between the first electrode and the second electrode is controlled to comprise the first threshold voltage and the second threshold voltage;

under control of the first threshold voltage, one blue light-emitting layer of the at least two blue light-emitting layers emits light; and under control of the second threshold voltage, another blue light-emitting layer of the at least two blue light-emitting layers emits light.

10. The driving method according to claim 9, wherein the first electrode is an anode, the second electrode is a cathode, and two blue light-emitting layers are disposed on the side, facing away from the hole injection layer, of the hole transport layer; wherein the applying voltages to the first electrode and the second electrode of the light-emitting device; comprises:

applying voltages to the first electrode and the second electrode and controlling the voltage difference between the first electrode and the second electrode to be the first threshold voltage, to allow a blue light-emitting layer, farther from an anode layer, of the two blue light-emitting layers to emit light; and applying voltages to the first electrode and the second electrode and controlling the voltage difference between the first electrode and the second electrode to be the second threshold voltage, to allow a blue light-emitting layer, closer to the anode layer, of the two blue light-emitting layers to emit light.

* * * * *